(12) United States Patent
Zhang et al.

(10) Patent No.: US 9,773,851 B2
(45) Date of Patent: Sep. 26, 2017

(54) OLED DISPLAY DEVICE COMPRISING AN INSULATIVE LAYER OF VARYING THICKNESS AND MANUFACTURING METHOD THEREOF

(71) Applicant: Shenzhen China Star Optoelectronics Technology Co., Ltd., Shenzhen, Guangdong (CN)

(72) Inventors: Hejing Zhang, Guangdong (CN); Chihyu Su, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 238 days.

(21) Appl. No.: 14/429,354

(22) PCT Filed: Feb. 9, 2015

(86) PCT No.: PCT/CN2015/072484
§ 371 (c)(1),
(2) Date: Mar. 18, 2015

(87) PCT Pub. No.: WO2016/090747
PCT Pub. Date: Jun. 16, 2016

(65) Prior Publication Data
US 2016/0343786 A1 Nov. 24, 2016

(30) Foreign Application Priority Data
Dec. 12, 2014 (CN) .......................... 2014 1 0768553

(51) Int. Cl.
*H01L 27/32* (2006.01)
*H01L 51/52* (2006.01)

(52) U.S. Cl.
CPC ........ *H01L 27/3258* (2013.01); *H01L 27/322* (2013.01); *H01L 27/3213* (2013.01);
(Continued)

(58) Field of Classification Search
CPC ..................................................... H01L 27/3258
See application file for complete search history.

(56) References Cited

U.S. PATENT DOCUMENTS

2011/0316007 A1* 12/2011 Sagawa ............... H01L 27/3246
257/88
2013/0120981 A1* 5/2013 Kim .......................... F21V 9/08
362/231
(Continued)

FOREIGN PATENT DOCUMENTS

CN 103681736 A 3/2014

*Primary Examiner* — Marcos D Pizarro
*Assistant Examiner* — Christopher M Roland
(74) *Attorney, Agent, or Firm* — Andrew C. Cheng

(57) ABSTRACT

The present invention provides an OLED display device and a manufacture method thereof. By locating a thickness of a part of the second insulative layer correspondingly positioned above the bottom layer wiring in the white sub pixel area is larger than a thickness of other part of the second insulative layer in the white sub pixel area, increase a vertical distance from the bottom layer wiring to the first electrode in the white sub pixel area, and thus, the short circuit, the overcurrent between the first electrode and the bottom layer wiring of the white sub pixel area can be prevented. The manufacture method of the OLED display device is simple, easy for operation, and the manufactured OLED display device can prevent the short circuit or the overcurrent between the first electrode and the bottom layer wiring of the white sub pixel area occur and raise the manufacture yield of the OLED display device.

11 Claims, 3 Drawing Sheets

(52) U.S. Cl.
CPC ...... *H01L 27/3276* (2013.01); *H01L 27/3246* (2013.01); *H01L 27/3248* (2013.01); *H01L 51/525* (2013.01); *H01L 2227/323* (2013.01); *H01L 2251/5392* (2013.01); *H01L 2251/558* (2013.01)

(56) References Cited

U.S. PATENT DOCUMENTS

| | | | |
|---|---|---|---|
| 2013/0168655 A1* | 7/2013 | Yun | H01L 27/3213 257/88 |
| 2014/0042396 A1* | 2/2014 | Yang | H01L 51/5281 257/40 |
| 2016/0181328 A1* | 6/2016 | Zhang | H01L 27/3213 257/40 |
| 2016/0343779 A1* | 11/2016 | Zhang | H01L 51/56 |

* cited by examiner step 1, providing a first substrate (1), and manufacturing a thin film transistor (3) and a bottom layer wiring (2) on the first substrate (1), and forming a second insulative layer (4) on the bottom layer wiring (2), the thin film transistor (3) and the first substrate (1);

step 2, locating a red light filter on the second insulative layer (4) in a red sub pixel area, and locating a green light filter on the second insulative layer (4) in a green sub pixel area, and locating a blue light filter (25) on the second insulative layer (4) in a blue sub pixel area; then, forming a third insulative layer (5) on the second insulative layer (4) and the red light, the green light and the blue light filters;

step 3, sequentially forming a first electrode (6) and an organic layer (7) on the third insulative layers (5) in each sub pixel area of the red sub pixel area, the green sub pixel area and the blue sub pixel area, the white sub pixel area, and meanwhile, forming a spacer layer (10) on the third insulative layer (5) between every two adjacent sub pixel areas; then, forming a second electrode (8) on the organic layer (7) and the spacer layer (10), and locating a second substrate (9) on the second electrode (8).

Fig. 3

OLED DISPLAY DEVICE COMPRISING AN INSULATIVE LAYER OF VARYING THICKNESS AND MANUFACTURING METHOD THEREOF

FIELD OF THE INVENTION

The present invention relates to a display technology field, and more particularly to an OLED display device and a manufacture method thereof.

BACKGROUND OF THE INVENTION

The Organic Light Emitting Diode (OLED) is a display technology which has great prospects for development. It does not only possess extremely excellent display performance but also properties of self-illumination, simple structure, ultra thin, fast response speed, wide view angle, low power consumption and capability of realizing flexible display, and therefore is considered as "dream display". It has been favored by respective big display makers and has become the main selection of the third generation display element.

An OLED display device generally comprises a substrate, an anode located on the substrate, an organic emitting layer located on the anodes, an electron transport layer located on the organic emitting layer, and a cathode located on the electron transport layer. As working, the Hole from the anode and the Electron from the cathode are injected to the organic emitting layer, these electrons and the holes are combined to generate excited electron-hole pairs, and the excited electron-hole pairs are converted from the excited state to the ground state for achieving illumination.

In the manufacture process of the OLED display device, for decreasing the process difficulty and the color and the brightness deterioration of the luminescent material, the display method of four colors sub pixels comprising Red(R), Green(G), Blue(B), White(W) is commonly utilized. That is so called WRGB OLED display. The working principle of the WRGB OLED display is to utilize the white organic light emitting diode to emit light and the color filters to transfer the white light to be red light, green light and blue light for realizing the OLED display device with WRGB four colors display.

As shown in FIG. 1, in the pixel structure of the present WRGB OLED, the utilized organic light emitting diodes are white organic light emitting diodes. The red, the green and the blue sub pixels respectively comprise filters 300 transferring the white light to be red light, green light and blue light. The white sub pixels remain to emit white light as what they do without filters 300. Therefore, the layer where the white organic light emitting diode of the white sub pixel is formed is lower than the layer where the organic light emitting diodes of the red/green/blue sub pixels are formed. The first electrode layer 100 in the white sub pixel is also lower than the first electrode layers 100' of the red, the green, the blue sub pixels. The vertical distance y1 between the first electrode layer 100 and the bottom layer wiring 400 of the white sub pixel is smaller than the vertical distance y2 between the first electrode layer 100' and the bottom layer wiring 400 of the red, the green, the blue sub pixels. The pixel structures of the blue sub pixel and the white sub pixel in FIG. 1 are illustrated for explanation.

In practical manufacture process, the impurity substance can be involved due to the improper treatment (such as photo residual glue, unclean etching), and easily cause effect to the white sub pixel of which the vertical distance between the bottom layer wiring 400 and the first electrode layer 100 is smaller. The overlap area 200 of the bottom layer wiring 400 and the first electrode 100 can cause the short circuit or overcurrent between the bottom layer wiring 400 and the first electrode 100.

SUMMARY OF THE INVENTION

An objective of the present invention is to provide an OLED display device, which can prevent the short circuit or the overcurrent between the first electrode and the bottom layer wiring of the white sub pixel area occur.

Another objective of the present invention is to provide a manufacture method of an OLED display device, which is simple, easy for operation, and the OLED display device manufactured by the method can prevent the short circuit or the overcurrent between the first electrode and the bottom layer wiring of the white sub pixel area occur and raise the manufacture yield of the OLED display device.

For realizing the aforesaid objectives, the present invention provides an OLED display device, comprising a red sub pixel area, a green sub pixel area, a blue sub pixel area and a white sub pixel area;

wherein the white sub pixel area comprises: a first substrate, a bottom layer wiring and a thin film transistor located on the first substrate, a second insulative layer located on the bottom layer wiring, the thin film transistor and the first substrate, a third insulative layer located on the second insulative layer, a first electrode located on the third insulative layer, an organic layer located on the first electrode, a second electrode located on the organic layer and a second substrate located on the second electrode;

a thickness of a part of the second insulative layer correspondingly positioned above the bottom layer wiring in the white sub pixel area is larger than a thickness of other part of the second insulative layer in the white sub pixel area.

The red sub pixel area comprises: a first substrate, a bottom layer wiring and a thin film transistor located on the first substrate, a second insulative layer located on the bottom layer wiring, the thin film transistor and the first substrate, a red light filter located on the second insulative layer, a third insulative layer located on the red light filter, a first electrode located on the third insulative layer, an organic layer located on the first electrode, a second electrode located on the organic layer and a second substrate located on the second electrode;

the green sub pixel area comprises: a first substrate, a bottom layer wiring and a thin film transistor located on the first substrate, a second insulative layer located on the bottom layer wiring, the thin film transistor and the first substrate, a green light filter located on the second insulative layer, a third insulative layer located on the green light filter, a first electrode located on the third insulative layer, an organic layer located on the first electrode, a second electrode located on the organic layer and a second substrate located on the second electrode;

the blue sub pixel area comprises: a first substrate, a bottom layer wiring and a thin film transistor located on the first substrate, a second insulative layer located on the bottom layer wiring, the thin film transistor and the first substrate, a blue light filter located on the second insulative layer, a third insulative layer located on the blue light filter, a first electrode located on the third insulative layer, an organic layer located on the first electrode, a second electrode located on the organic layer and a second substrate located on the second electrode.

A spacer layer is formed between any two adjacent sub pixel areas in the red sub pixel area, the green sub pixel area, the blue sub pixel area and the white sub pixel area, and the spacer layer is between the third insulative layer and the second electrode, and separates the first electrode and the organic layer in two adjacent sub pixel areas.

The first substrate is a transparent substrate; the first electrode is an anode, which is a transparent electrode; the second electrode is a cathode, which is a reflective electrode.

The first electrode is electrically connected to the thin film transistor through a via hole penetrating the second insulative layer and the third insulative layer.

The present invention further provides a manufacture method of an OLED display device, comprising steps of:

step 1, providing a first substrate, and manufacturing a thin film transistor and a bottom layer wiring on the first substrate, and forming a second insulative layer on the bottom layer wiring, the thin film transistor and the first substrate;

step 2, locating a red light filter on the second insulative layer in a red sub pixel area, and locating a green light filter on the second insulative layer in a green sub pixel area, and locating a blue light filter on the second insulative layer in a blue sub pixel area; then, forming a third insulative layer on the second insulative layer and the red light, the green light and the blue light filters;

step 3, sequentially forming a first electrode and an organic layer on the third insulative layers in each sub pixel area of the red sub pixel area, the green sub pixel area, the blue sub pixel area and the white sub pixel area, and meanwhile, forming a spacer layer on the third insulative layer between every two adjacent sub pixel areas; then, forming a second electrode on the organic layer and the spacer layer, and locating a second substrate on the second electrode.

In the step 1, a thickness of a part of the second insulative layer correspondingly positioned above the bottom layer wiring in the white sub pixel area is larger than a thickness of other part of the second insulative layer in the white sub pixel area.

In the step 1, the manufacture step of the thin film transistor is: sequentially deposing a gate layer, a first insulative layer located on the gate layer, a semiconductor layer located on the first insulative layer and a source/a drain layer located on the semiconductor layer on the first substrate.

The first substrate is a transparent substrate; the first electrode is an anode, which is a transparent electrode; the second electrode is a cathode, which is a reflective electrode.

The step 3 further comprises a step of: forming a via hole in the second insulative layer and the third insulative layer, and the first electrode is electrically connected to the thin film transistor through the via hole penetrating the second insulative layer and the third insulative layer.

The present invention further provides an OLED display device, comprising a red sub pixel area, a green sub pixel area, a blue sub pixel area and a white sub pixel area;

wherein the white sub pixel area comprises: a first substrate, a bottom layer wiring and a thin film transistor located on the first substrate, a second insulative layer located on the bottom layer wiring, the thin film transistor and the first substrate, a third insulative layer located on the second insulative layer, a first electrode located on the third insulative layer, an organic layer located on the first electrode, a second electrode located on the organic layer and a second substrate located on the second electrode;

a thickness of a part of the second insulative layer correspondingly positioned above the bottom layer wiring in the white sub pixel area is larger than a thickness of other part of the second insulative layer in the white sub pixel area;

wherein the red sub pixel area comprises: a first substrate, a bottom layer wiring and a thin film transistor located on the first substrate, a second insulative layer located on the bottom layer wiring, the thin film transistor and the first substrate, a red light filter located on the second insulative layer, a third insulative layer located on the red light filter, a first electrode located on the third insulative layer, an organic layer located on the first electrode, a second electrode located on the organic layer and a second substrate located on the second electrode;

the green sub pixel area comprises: a first substrate, a bottom layer wiring and a thin film transistor located on the first substrate, a second insulative layer located on the bottom layer wiring, the thin film transistor and the first substrate, a green light filter located on the second insulative layer, a third insulative layer located on the green light filter, a first electrode located on the third insulative layer, an organic layer located on the first electrode, a second electrode located on the organic layer and a second substrate located on the second electrode;

the blue sub pixel area comprises: a first substrate, a bottom layer wiring and a thin film transistor located on the first substrate, a second insulative layer located on the bottom layer wiring, the thin film transistor and the first substrate, a blue light filter located on the second insulative layer, a third insulative layer located on the blue light filter, a first electrode located on the third insulative layer, an organic layer located on the first electrode, a second electrode located on the organic layer and a second substrate located on the second electrode;

wherein the first substrate is a transparent substrate; the first electrode is an anode, which is a transparent electrode; the second electrode is a cathode, which is a reflective electrode;

wherein the first electrode is electrically connected to the thin film transistor through a via hole penetrating the second insulative layer and the third insulative layer.

The benefits of the present invention are: the present invention provides an OLED display device and a manufacture method thereof. By locating a thickness of a part of the second insulative layer correspondingly positioned above the bottom layer wiring in the white sub pixel area is larger than a thickness of other part of the second insulative layer in the white sub pixel area, increase a vertical distance from the bottom layer wiring to the first electrode in the white sub pixel area, and thus, the short circuit, the overcurrent between the first electrode and the bottom layer wiring of the white sub pixel can be prevented. The manufacture method is simple, easy for operation, and can prevent the short circuit or the overcurrent between the first electrode and the bottom layer wiring of the white sub pixel area occur and raise the manufacture yield of the OLED display device.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings,

FIG. 3 is a flowchart of a manufacture method of an OLED display device according to the present invention.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
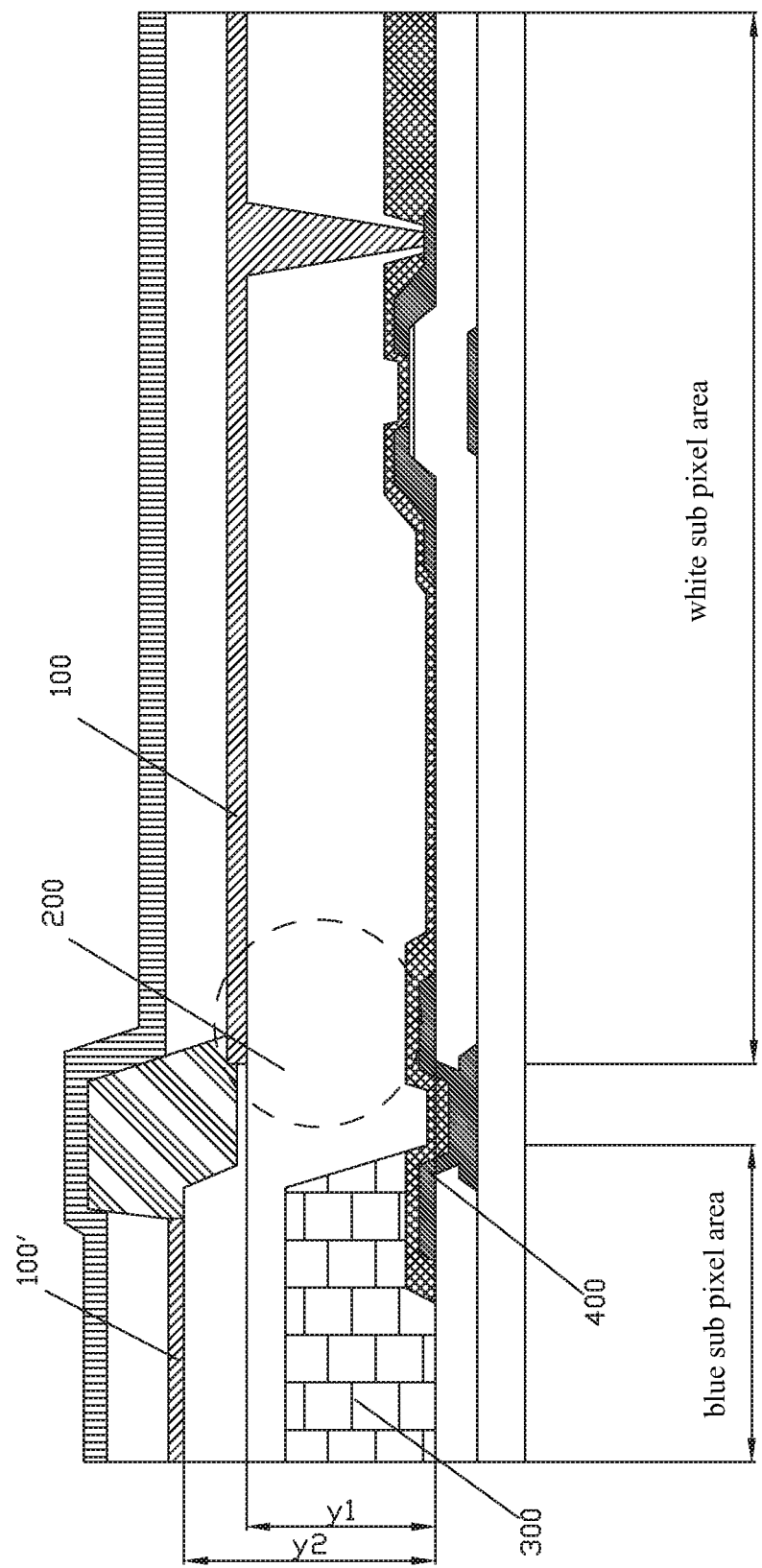
FIG. 1 is a diagram of an OLED display device utilizing WRGB technology according to prior art.
Figure 2:
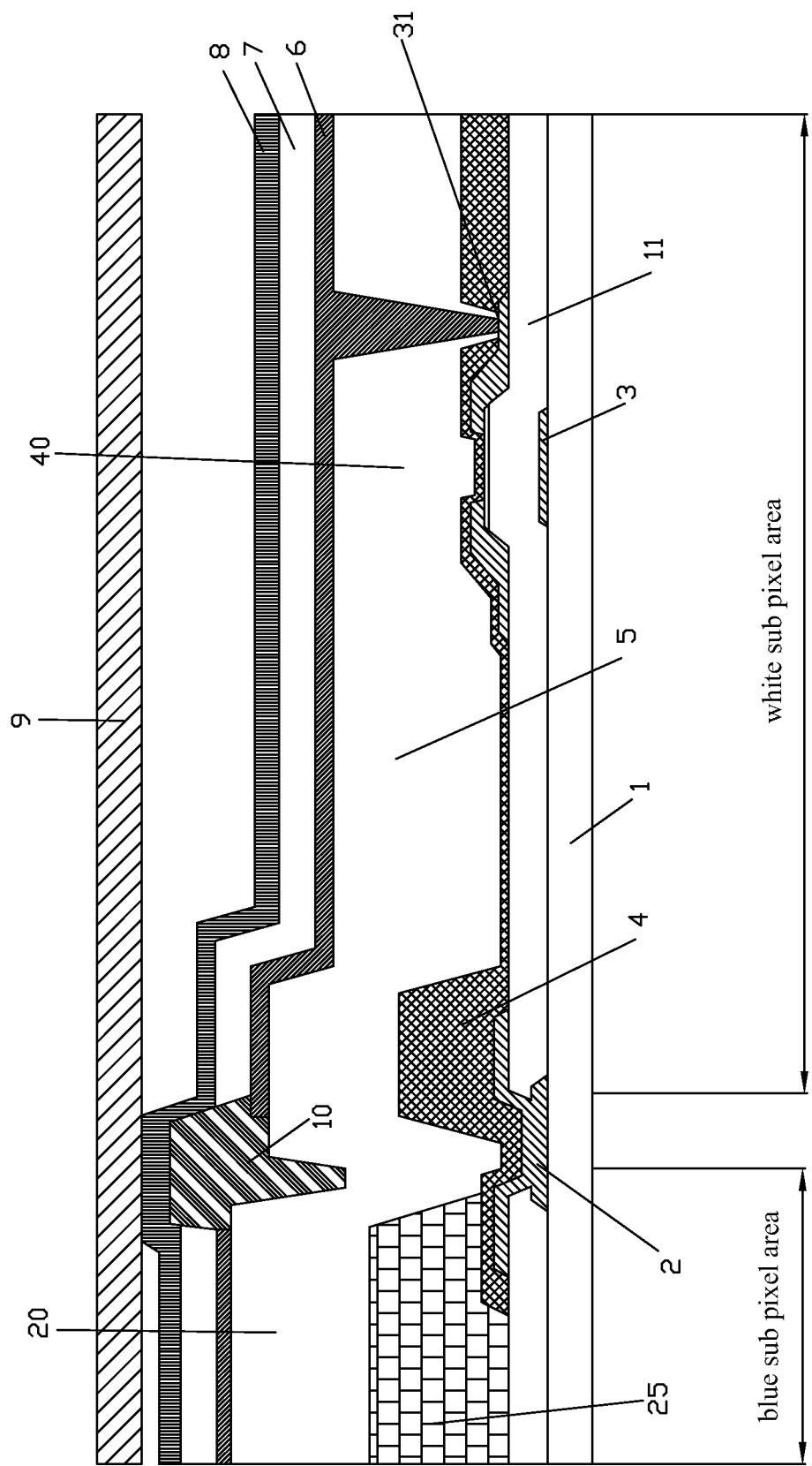
FIG. 2 is a diagram of an OLED display device according to the present invention.

Please refer to FIG. 2, the present invention provides an OLED display device, comprising a red sub pixel area, a green sub pixel area, a blue sub pixel area 20 and a white sub pixel area 40.

The white sub pixel area 40 comprises a first substrate 1, a bottom layer wiring 2 and a thin film transistor 3 located on the first substrate 1, a second insulative layer 4 located on the bottom layer wiring 2, the thin film transistor 3 and the first substrate 1, a third insulative layer 5 located on the second insulative layer 4, a first electrode 6 located on the third insulative layer 5, an organic layer 7 located on the first electrode 6, a second electrode 8 located on the organic layer 7 and a second substrate 9 located on the second electrode 8;

a thickness of a part of the second insulative layer 4 correspondingly positioned above the bottom layer wiring 2 in the white sub pixel area 40 is larger than a thickness of other part of the second insulative layer 4 in the white sub pixel area 40.

The blue sub pixel area 20 comprises a first substrate 1, a bottom layer wiring 2 and a thin film transistor 3 located on the first substrate 1, a second insulative layer 4 located on the bottom layer wiring 2, the thin film transistor 3 and the first substrate 1, a blue light filter 25 located on the second insulative layer 4, a third insulative layer 5 located on the blue light filter 25, a first electrode 6 located on the third insulative layer 5, an organic layer 7 located on the first electrode 6, a second electrode 8 located on the organic layer 7 and a second substrate 9 located on the second electrode 8;

the red sub pixel area (not shown) comprises a first substrate 1, a bottom layer wiring 2 and a thin film transistor 3 located on the first substrate 1, a second insulative layer 4 located on the bottom layer wiring 2, the thin film transistor 3 and the first substrate 1, a red light filter located on the second insulative layer 4, a third insulative layer 5 located on the red light filter, a first electrode 6 located on the third insulative layer 5, an organic layer 7 located on the first electrode 6, a second electrode 8 located on the organic layer 7 and a second substrate 9 located on the second electrode 8;

the green sub pixel area (not shown) comprises a first substrate 1, a bottom layer wiring 2 and a thin film transistor 3 located on the first substrate 1, a second insulative layer 4 located on the bottom layer wiring 2, the thin film transistor 3 and the first substrate 1, a green light filter located on the second insulative layer 4, a third insulative layer 5 located on the green light filter, a first electrode 6 located on the third insulative layer 5, an organic layer 7 located on the first electrode 6, a second electrode 8 located on the organic layer 7 and a second substrate 9 located on the second electrode 8.

Besides, a spacer layer 10 is formed between any two adjacent sub pixel areas in the red sub pixel area, the green sub pixel area, the blue sub pixel area 20 and the white sub pixel area 40. The spacer layer 10 is between the third insulative layer 5 and the second electrode 8, and separates the first electrode 6 and the organic layer 7 in two adjacent sub pixel areas. The spacer layer 10 does not only separate the adjacent sub pixel areas but also supports the second substrate 9. Preferably, the spacer layer 10 is manufactured with insulative material.

Specifically, the bottom layer wiring 2 comprises signal lines, such as data line DL1-DLn and SL1-SLm and power lines, such as high voltage level power lines EVDD and low voltage level power lines EVSS. If the sub pixel comprises a compensation circuit, the bottom layer wiring may further comprise auxiliary power line for providing auxiliary voltages, reference power lines for providing reference voltages, and initialization power lines for providing initialization voltages.

Specifically, the first substrate 1 is a transparent substrate, and the first electrode 6 is an anode, which is a transparent electrode manufactured with transparent conductive material, such as ITO (Indium-Tin-Oxide); the second electrode 8 is a cathode, which is a reflective electrode manufactured by metal material, such as aluminum, magnesium or silver.

Specifically, the organic layer 7 comprises: a Hole Transport Layer located on the first electrode 6, a white light emitting layer located on the Hole Transport Layer, an Electron Transport Layer located on the white light emitting layer; as a certain driving voltage is applied between the first electrode 6 and the second electrode 8, the Electron and the Hole are respectively injected into the Electron Transport Layer and Hole Transport Layer from the second electrode 8 and the first electrode 6, and the Electron and the Hole respectively migrate from the Electron Transport Layer and Hole Transport Layer to the emitting layer and bump into each other in the white light emitting layer to form an exciton to excite the emitting molecule. The latter can illuminate after the radiative relaxation. The light directly goes out by passing through the transparent first electrode 6 or goes out by passing through the transparent first electrode 6 after being reflected by the reflective second electrode 8.

Specifically, the thin film transistor 3 comprises a gate layer located on the first substrate 1, a first insulative layer 11 located on the gate layer, a semiconductor layer located on the first insulative layer 11 and a source/a drain layer located on the semiconductor layer. The first electrode 6 is electrically connected to the drain of the thin film transistor 3 through a via hole 31 penetrating the second insulative layer 4 and the third insulative layer 5.

Please refer to FIG. 3. The present invention further provides a manufacture method of the aforementioned OLED display device, comprising steps of:

step 1, providing a first substrate 1, and manufacturing a thin film transistor 3 and a bottom layer wiring 2 on the first substrate 1, and forming a second insulative layer 4 on the bottom layer wiring 2, the thin film transistor 3 and the first substrate 1.

The bottom layer wiring 2 comprises signal lines, such as data line DL1-DLn and SL1-SLm and power lines, such as high voltage level power lines EVDD and low voltage level power lines EVSS. If the sub pixel comprises a compensation circuit, the bottom layer wiring may further comprise auxiliary power line for providing auxiliary voltages, reference power lines for providing reference voltages, and initialization power lines for providing initialization voltages.

Specifically, a thickness of a part of the second insulative layer 4 correspondingly positioned above the bottom layer wiring 2 in the white sub pixel area 40 is larger than a thickness of other part of the second insulative layer 4 in the white sub pixel area 40.

Specifically, the manufacture step of the thin film transistor 3 is: sequentially deposing a gate layer, a first insulative layer 11 located on the gate layer, a semiconductor layer located on the first insulative layer 11 and a source/a drain layer located on the semiconductor layer on the first substrate 1.

step 2, locating a red light filter on the second insulative layer 4 in a red sub pixel area, and locating a green light filter on the second insulative layer 4 in a green sub pixel area, and locating a blue light filter on the second insulative layer 4 in a blue sub pixel area; then, forming a third insulative layer 5 on the second insulative layer 4 and the red light, the green light and the blue light filters.

step 3, sequentially forming a first electrode 6 and an organic layer 7 on the third insulative layers 5 in each sub pixel area of the white sub pixel area 40, the red sub pixel area, the green sub pixel area and the blue sub pixel area 20 and meanwhile, forming a spacer layer 10 on the third insulative layer 5 between every two adjacent sub pixel areas; then, forming a second electrode 8 on the organic layer 7 and the spacer layer 10, and locating a second substrate 9 on the second electrode 8.

The spacer layer 10 does not only separate the adjacent sub pixel areas but also supports the second substrate 9. The spacer layer 10 is constructed with insulative material.

The step 3 further comprises a step of: forming a via hole 31 in the second insulative layer 4 and the third insulative layer 5, and the first electrode 6 is electrically connected to the drain of the thin film transistor 3 through the via hole 31 penetrating the second insulative layer 4 and the third insulative layer 5.

The present invention provides an OLED display device and a manufacture method thereof. By locating a thickness of a part of the second insulative layer correspondingly positioned above the bottom layer wiring in the white sub pixel area is larger than a thickness of other part of the second insulative layer in the white sub pixel area, increase a vertical distance from the bottom layer wiring to the first electrode in the white sub pixel area, and thus, the short circuit, the overcurrent between the first electrode and the bottom layer wiring of the white sub pixel area can be prevented. The manufacture method of the OLED display device is simple, easy for operation, and the manufactured OLED display device can prevent the short circuit or the overcurrent between the first electrode and the bottom layer wiring of the white sub pixel area occur and raise the manufacture yield of the OLED display device.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode (OLED) display device, comprising a red sub pixel area, a green sub pixel area, a blue sub pixel area and a white sub pixel area;
   wherein the white sub pixel area comprises: a first substrate, a bottom layer wiring and a thin film transistor located on the first substrate, a second insulative layer located on the bottom layer wiring, the thin film transistor and the first substrate, a third insulative layer located on the second insulative layer, a first electrode boated on the third insulative layer, an organic layer located on the first electrode, a second electrode located on the organic layer and a second substrate located on the second electrode; and
   a thickness of a part of the second insulative layer correspondingly positioned above the bottom layer wiring in the white sub pixel area is larger than a thickness of another part of the second insulative layer in the white sub pixel area such that a part of the first electrode boated above the part of the second insulative layer is spaced from the first substrate farther than a remaining part of the first electrode.

2. The OLED display device according to claim 1, wherein the red sub pixel area comprises: a first substrate, a bottom layer wiring and a thin film transistor located on the first substrate, a second insulative layer located on the bottom layer wiring, the thin film transistor and the first substrate, a red light filter located on the second insulative layer, a third insulative layer located on the red light filter, a first electrode located on the third insulative layer, an organic layer located on the first electrode, a second electrode located on the organic layer and a second substrate located on the second electrode;
   wherein the green sub pixel area comprises: a first substrate, a bottom layer wiring and a thin film transistor located on the first substrate, a second insulative layer located on the bottom layer wiring, the thin film transistor and the first substrate, a green light filter located on the second insulative layer, a third insulative layer located on the green light filter, a first electrode located on the third insulative layer, an organic layer located on the first electrode, a second electrode located on the organic layer and a second substrate located on the second electrode;
   the blue sub pixel area comprises: a first substrate, a bottom layer wiring and a thin film transistor located on the first substrate, a second insulative layer located on the bottom layer wiring, the thin film transistor and the first substrate, a blue light filter located on the second insulative layer, a third insulative layer located on the blue light filter, a first electrode located on the third insulative layer, an organic layer located on the first electrode, a second electrode located on the organic layer and a second substrate located on the second electrode.

3. The OLED display device according to claim 2, wherein a spacer layer is formed between any two adjacent sub pixel areas in the red sub pixel area, the green sub pixel area, the blue sub pixel area and the white sub pixel area, and the spacer layer is between the third insulative layer and the second electrode, and separates the first electrode and the organic layer in two adjacent sub pixel areas.

4. The OLED display device according to claim 1, wherein the first substrate is a transparent substrate; the first electrode is an anode, which is a transparent electrode; the second electrode is a cathode, which is a reflective electrode.

5. The OLED display device according to claim 1, wherein the first electrode is electrically connected to the thin film transistor through a via hole penetrating the second insulative layer and the third insulative layer.

6. A manufacture method of an organic light emitting diode (OLED) display device, comprising steps of:
   step 1, providing a first substrate, and manufacturing a thin film transistor and a bottom layer wiring on the first substrate, and forming a second insulative layer on the bottom layer wiring, the thin film transistor and the first substrate;
   step 2, locating a red light filter on the second insulative layer in a red sub pixel area, and locating a green light filter on the second insulative layer in a green sub pixel area, and locating a blue light filter on the second insulative layer in a blue sub pixel area; then, forming a third insulative layer on the second insulative layer and the red light, the green light and the blue light filters; and
   step 3, sequentially forming a first electrode and an organic layer on the third insulative layers in each sub pixel area of the red sub pixel area, the green sub pixel area, the blue sub pixel area and a white sub pixel area, and meanwhile, forming a spacer layer on the third insulative layer between every two adjacent sub pixel areas; then, forming a second electrode on the organic layer and the spacer layer, and locating a second substrate on the second electrode;
   wherein a thickness of a part of the second insulative layer correspondingly positioned above the bottom layer wiring in the white sub pixel area is larger than a thickness of another part of the second insulative layer in the white sub pixel area such that a part of the first electrode located above the part of the second insulative layer is spaced from the first substrate farther than a remaining part of the first electrode.

7. The manufacture method of the OLED display device according to claim 6, wherein in step 1, an operation for manufacturing the thin film transistor comprises: forming, in sequence, a gate layer, a first insulative layer located on the gate layer, a semiconductor layer located on the first insulative layer and a source/a drain layer located on the semiconductor layer on the first substrate.

8. The manufacture method of the OLED display device according to claim 6, wherein the first substrate is a transparent substrate; the first electrode is an anode, which is a transparent electrode; the second electrode is a cathode, which is a reflective electrode.

9. The manufacture method of the OLED display device according to claim 6, wherein step 3 further comprises a step of: forming a via hole in the second insulative layer and the third insulative layer, such that the first electrode is electrically connected to the thin film transistor through the via hole penetrating the second insulative layer and the third insulative layer.

10. An organic light emitting diode (OLED) display device, comprising a red sub pixel area, a green sub pixel area, a blue sub pixel area and a white sub pixel area;
   wherein the white sub pixel area comprises: a first substrate, a bottom layer wiring and a thin film transistor located on the first substrate, a second insulative layer located on the bottom layer wiring, the thin film transistor and the first substrate, a third insulative layer located on the second insulative layer, a first electrode located on the third insulative layer, an organic layer located on the first electrode, a second electrode located on the organic layer and a second substrate boated on the second electrode; and
   a thickness of a part of the second insulative layer correspondingly positioned above the bottom layer wiring in the white sub pixel area is larger than a thickness of another part of the second insulative layer in the white sub pixel area such that a part of the first electrode located above the part of the second insulative layer is spaced from the first substrate farther than a remaining part of the first electrode;
   wherein the red sub pixel area comprises: a first substrate, a bottom layer wiring and a thin film transistor boated on the first substrate, a second insulative layer boated on the bottom layer wiring, the thin film transistor and the first substrate, a red light filter located on the second insulative layer, a third insulative layer boated on the red light filter, a first electrode located on the third insulative layer, an organic layer located on the first electrode, a second electrode located on the organic layer and a second substrate boated on the second electrode;
   the green sub pixel area comprises: a first substrate, a bottom layer wiring and a thin film transistor located on the first substrate, a second insulative layer located on the bottom layer wiring, the thin film transistor and the first substrate, a green light filter located on the second insulative layer, a third insulative layer located on the green light filter, a first electrode located on the third insulative layer, an organic layer boated on the first electrode, a second electrode located on the organic layer and a second substrate boated on the second electrode; and
   the blue sub pixel area comprises: a first substrate, a bottom layer wiring and a thin film transistor located on the first substrate, a second insulative layer located on the bottom layer wiring, the thin film transistor and the first substrate, a blue light filter boated on the second insulative layer, a third insulative layer boated on the blue light filter, a first electrode located on the third insulative layer, an organic', layer boated on the first electrode, a second electrode located on the organic layer and a second substrate located on the second electrode;
   wherein the first substrate is a transparent substrate; the first electrode is an anode, which is a transparent electrode; the second electrode is a cathode, which is a reflective electrode; and
   wherein the first electrode is electrically connected to the thin film transistor through a via hole penetrating the second insulative layer and the third insulative layer.

11. The OLED display device according to claim 10, wherein a spacer layer is formed between any two adjacent sub pixel areas in the red sub pixel area, the green sub pixel area, the blue sub pixel area and the white sub pixel area, and the spacer layer is between the third insulative layer and the second electrode, and separates the first electrode and the organic layer in two adjacent sub pixel areas.

* * * * *